US006429507B1

(12) United States Patent
Knudtsen et al.

(10) Patent No.: US 6,429,507 B1
(45) Date of Patent: Aug. 6, 2002

(54) ELECTRICAL DEVICE INCLUDING A LEADED CELL ASSEMBLY

(75) Inventors: Stephen F. Knudtsen; Robert V. White, both of Broomfield; Kathryn J. Teuber, Nederland, all of CO (US)

(73) Assignee: Artesyn Technologies, Inc., Eden Prairie, MN (US)

( * ) Notice: Subject to any disclaimer, the term of this patent is extended or adjusted under 35 U.S.C. 154(b) by 0 days.

(21) Appl. No.: 09/541,843

(22) Filed: Apr. 3, 2000

(51) Int. Cl.[7] .............................................. H01L 23/02
(52) U.S. Cl. ........................ 257/678; 257/666; 257/655
(58) Field of Search ................................ 257/678, 666, 257/685; 438/123, 106, 121; 361/704, 707, 813

(56) References Cited

U.S. PATENT DOCUMENTS

| 5,400,235 A | 3/1995 | Carroll | 363/17 |
| 5,923,083 A | 7/1999 | Autry et al. | 257/688 |
| 5,926,373 A | * 7/1999 | Stevens | 361/704 |
| 5,973,923 A | 10/1999 | Jitaru | 361/704 |
| 6,144,571 A | * 11/2000 | Sasaki et al. | 363/144 |
| 6,147,869 A | * 11/2000 | Furival | 361/719 |

FOREIGN PATENT DOCUMENTS

| JP | 5-235246 | * 9/1993 | 257/678 |

* cited by examiner

Primary Examiner—Jasmine J B Clark
(74) Attorney, Agent, or Firm—Kirkpatrick & Lockhart LLP (57) ABSTRACT

An electrical device. The electrical device includes a first substrate, a second substrate facing the first substrate, a unpackaged semiconductor die electrically and thermally connected to the first substrate, a first lead electrically connected between the unpackaged semiconductor die and the second substrate, and a second lead electrically connected between the first and second substrates.

23 Claims, 6 Drawing Sheets

ELECTRICAL DEVICE INCLUDING A LEADED CELL ASSEMBLY

CROSS-REFERENCE TO RELATED APPLICATIONS

Not Applicable.

STATEMENT REGARDING FEDERALLY SPONSORED RESEARCH AND DEVELOPMENT

Not Applicable.

BACKGROUND OF INVENTION

1. Field of Invention

The present invention relates generally to electronics and, more particularly, to the packaging and fabrication of electronic devices.

2. Description of the Background

Figure 1:
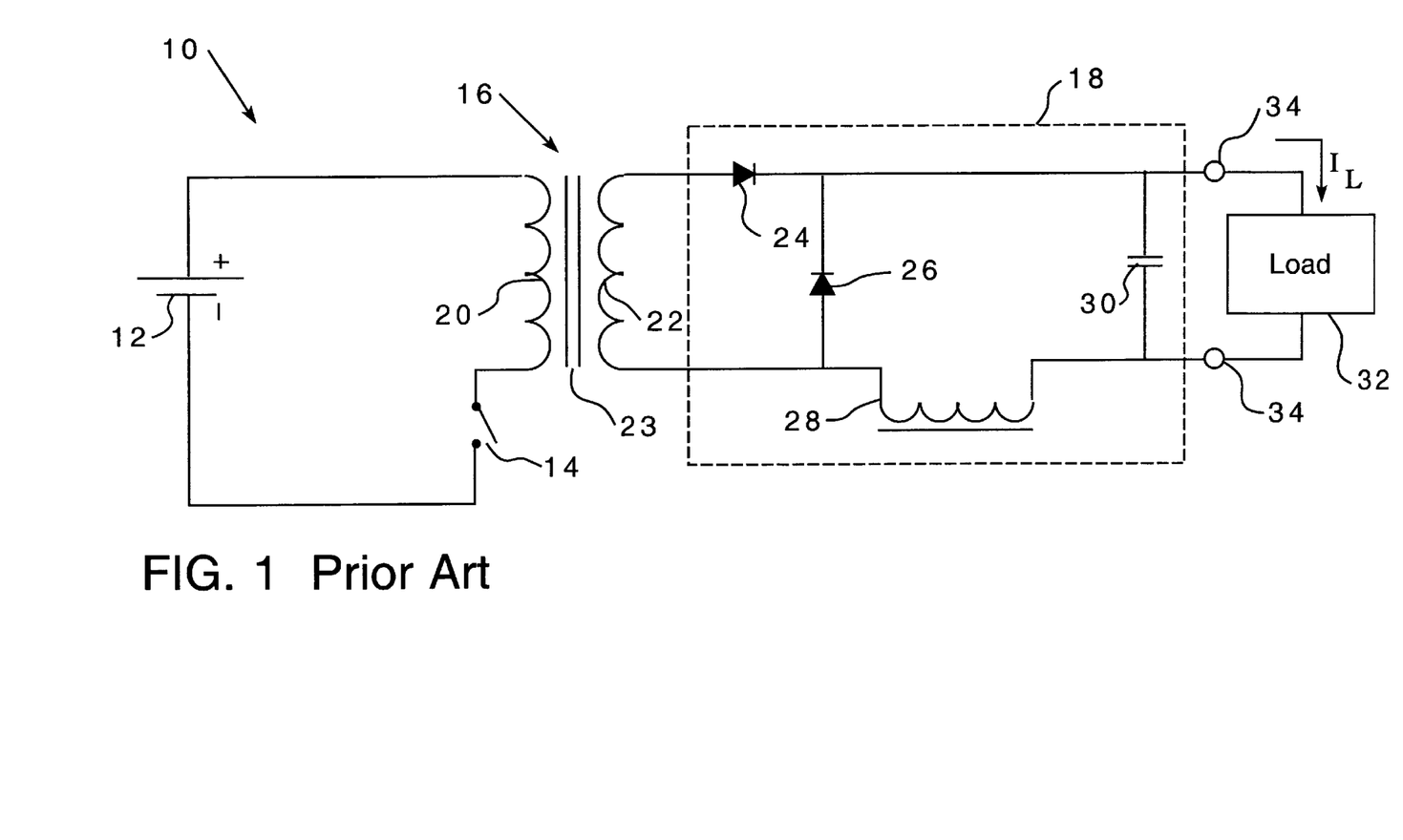
FIG. 1 is a schematic diagram of a prior art forward DC/DC converter.

DC-to-DC power converters are widely utilized in power supplies to convert an input DC voltage into a specified output DC voltage. FIG. 1 is a schematic diagram of one type of DC/DC forward converter 10. The converter 10 includes a DC voltage source 12, a primary switch 14, a transformer 16, and an output circuit 18. The transformer 16 includes a primary winding 20, a secondary winding 22, and a magnetic core 23. The primary switch 14 is coupled to the primary winding 20 of the transformer 16 such that when the primary switch 14 is closed, the DC voltage from the DC voltage source 12 is coupled across the primary winding 20. The converter 10 is referred to as a forward converter because power flow is gated by the primary switch 14 and energy is transferred forward, i.e., from the primary winding 20 of the transformer 16 to the secondary winding 22, during the conductive or ON period of the primary switch 14.

The secondary winding 22 of the transformer 16 is coupled to the output circuit 18 of the converter 10. The output circuit 18 includes a first rectifier 24, a second rectifier 26, an inductor 28, and a capacitor 30. When the primary switch 14 is closed (i.e., when there is a positive voltage across the primary winding 22), current induced on the secondary winding 22 by the primary winding 20 flows through the first rectifier 24. The current flows through the load 32 connected to the output terminals 34 of the converter 10 and back to the secondary winding 22. Conversely, during non-conductive or OFF time period of the primary switch 14 (i.e., when the primary switch 14 is open), the load current ($I_L$) flows through the second rectifier 26, and the current in the secondary winding 22 of the transformer 16 is essentially zero.

The inductor 28 and the capacitor 30 of the output circuit 18 form a filter to provide averaging and smoothing of the output voltage (i.e., the voltage across the output terminals 34) during the ON and OFF periods of the primary switch 14. The inductor 28 and capacitor 30 maintain the load current $I_L$ substantially constant during these time periods.

In the forward DC/DC converter industry, to ensure interoperability with power supplies from other manufacturers, converters are often fabricated according to a standard size, referred to as a brick, which is 4.6 inches× 2.4 inches×0.5 inches. Moreover, as the computer and communications industry continue their migration towards lower voltage logic, the DC/DC converter market is also driving towards higher power densities at lower costs. Conventionally, forward converters are fabricated by mounting individually packaged components, such as the transformer 16 and the rectifiers 24, 26 to a thermally and electrically conductive substrate. The packaging, in conjunction with the lead terminals for the components, adds considerably to the respective sizes of the components, and thereby limits how densely the individual components of the converter may be situated. For example, for the forward converter 10 shown in FIG. 1, the transformer 16 and the rectifiers 24, 26 each comprise individually packaged components, and the distance between each component, and hence the density of the converter 10, is limited by the packaging and lead terminals of the respective components.

Furthermore, the efficiency of the converter 10 is adversely affected by stray inductance introduced into the converter 10. Inductance in the converter 10 may be caused by any loop of current, and is proportional to the area of the loop. One solution to minimize the amount of stray inductance in the converter 10 is to physically locate the components of the converter 10 that form the loop close together, subject to other circuit constraints.

For example, as discussed hereinbefore, the load current $I_L$ of the converter 10 illustrated in FIG. 1 flows alternately through the first and second rectifiers 24, 26. During the changeover periods, the current decreases in one rectifier 24, 26 and increases in the other. The rate of change of the current in the rectifiers 24, 26 is limited by the stray inductance in the current path through the rectifiers 24, 26 and by the leakage inductance of the secondary winding 22 of the transformer 16. At the common cathode connection of the rectifiers 24, 26, and in the inductor 28, the current is essentially constant. In the path through the rectifiers 24, 26 where current changes rapidly, however, the stray inductance adversely affects the performance of the converter 10 and stores energy that may have to be dissipated in snubbers (not shown), thereby reducing overall efficiency. It is thus desirable to limit the inductance in this path of rapidly changing current. However, as discussed hereinbefore, the density of the components of the converter 10 is limited by the fact that the components are individually packaged and leaded.

Accordingly, there exists a need for a high-density converter circuit which minimizes the inductive loop between components to reduce the introduction of stray inductance into the converter.

BRIEF SUMMARY OF INVENTION

The present invention is directed to an electrical device. According to one embodiment, the electrical device includes a first substrate, a second substrate facing the first substrate, an unpackaged semiconductor die electrically and thermally connected to the first substrate, a first lead electrically connected between the unpackaged semiconductor die and the second substrate, and a second lead electrically connected between the first and second substrates. The first substrate may be electrically conductive, such as an insulated metal substrate. The second substrate may be a circuit board. The device may include a first conductive tab electrically and thermally connected between the unpackaged semiconductor die and the first substrate. The device may also include a second conductive tab electrically and thermally connected to the unpackaged semiconductor die and electrically connected to the first lead. According to one embodiment of the present invention, the unpackaged semiconductor die includes an unpackaged silicon die, and the first and second conductive tabs include molybdenum. In addition, the first lead may include a strain relief portion.

According to another embodiment, the present invention is directed to a converter including a first substrate, a second substrate facing the first substrate, an unpackaged rectifier electrically and thermally connected to the first substrate, a first lead electrically connected between the rectifier and the second substrate, a second lead electrically connected between the first and second substrates, and a transformer electrically connected to the second substrate. According to one embodiment, the rectifier is mounted to the first substrate in a position vertically above the position of the transformer on the substrate.

The benefits of the present invention may be utilized to realize converter circuits having a reduced inductance path between components, such as the output rectifiers and the transformer, thereby minimizing the amount of stray inductance introduced into the converter in comparison with conventional converter circuits including individually packaged components. In addition, by removing the packaging associated with the rectifiers of a conventional forward DC/DC converter, a converter utilizing the benefits of the present invention results in approximately twice the die area for the output rectifiers for the same footprint area of the substrate, therefore reducing costs and improving power conversion density. These and other benefits of the present invention will be apparent from the detailed description of the invention hereinbelow.

DESCRIPTION OF THE FIGURES

For the present invention to be clearly understood and readily practiced, the present invention will be described in conjunction with the following figures, wherein.

DETAILED DESCRIPTION OF THE INVENTION

Figure 2:
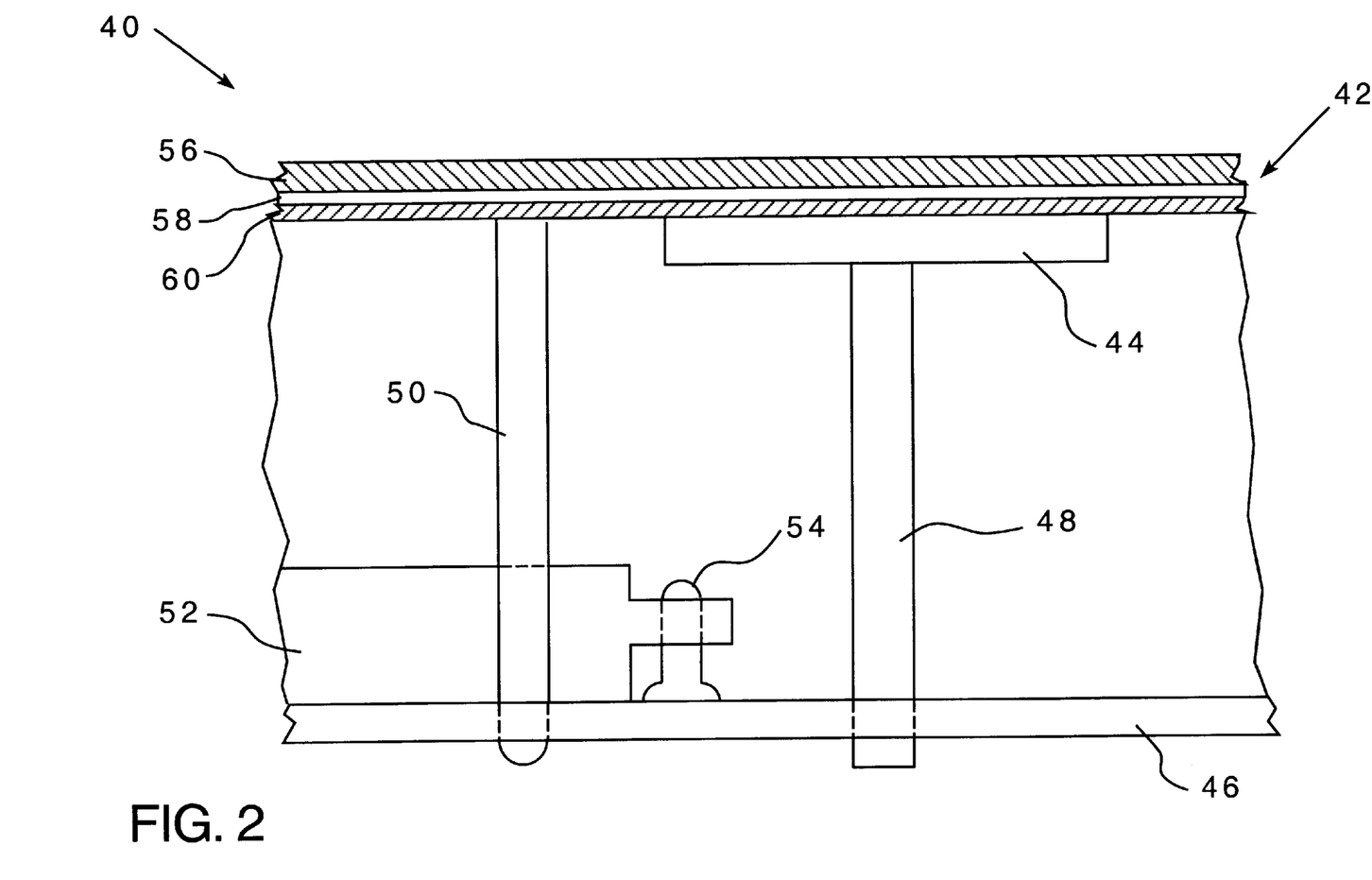
FIG. 2 is a cross-sectional diagram of an electrical device according to one embodiment of the present invention.

FIG. 2 is a cross-sectional diagram of an electrical device 40 according to one embodiment of the present invention. The device 40 includes a first substrate 42, a semiconductor component 44 connected to the first substrate 42, a second substrate 46, a first lead 48 interconnecting the semiconductor component 44 and the second substrate 46, and a second lead 50 interconnecting the first substrate 42 and the second substrate 46. The semiconductor component 44 in conjunction with the lead 48 may be referred to as a "leaded cell assembly."

The first substrate 42 and the second substrate 46 may face each other. That is, the first substrate 42 and the second substrate 46 may be opposed to each other in a vertically stacked and substantially parallel alignment relative to each other. The first substrate 42 may be, for example, an insulated metal substrate (IMS) including a first metal layer 56, a dielectric layer 58, and a second metal layer 60. The first metal layer 56 and the second metal layer 60 may be, for example, copper or aluminum, and each may be laminated to the dielectric layer 58. The dielectric layer 58 may be, for example, an electrically insulative, thermally conductive polymer such as, for example, polyimide. Components of the device 40, such as the semiconductor component 44, may be mounted to the second metal layer 60 of the first substrate 42 which provides a common interconnect node for the components. The first metal layer 56, when in thermal communication with the second metal layer 60 via the thermally conductive dielectric layer 58, acts to dissipate heat from components, such as the semiconductor component 44, mounted to the first substrate 42.

The semiconductor component 44 may be, for example, an unpackaged semiconductor device including at least two terminals. One terminal of the semiconductor component 44 may be mounted to the second metal layer 60 of the first substrate 42 using, for example, surface or through-hole construction mounting techniques. A second terminal of the semiconductor component 44 may be connected to the second substrate 46 via the first lead 48. The semiconductor component 44 may be fabricated in die form and may be, for example, a silicon die. The semiconductor component 44 may be, for example, a rectifier, such as a Schottky rectifier, a switch, such as a transistor, or any other semiconductor component.

For an embodiment of the present invention in which the semiconductor component 44 is a Schottky rectifier, the cathode terminal of the Schottky rectifier may be connected to the first substrate 42, and the anode terminal may be connected to the second substrate 46 via the lead 48. Such an embodiment may be utilized to realize a converter circuit, such as the forward DC/DC converter 10 illustrated in FIG. 1, as described further hereinbelow.

The leads 48, 50 comprise electrically conductive material and may be fabricated from, for example, copper or aluminum, and may be connected using, for example, standard soldering techniques. Utilizing copper for the leads 48, 50 provides a low resistance to current flowing to and from the semiconductor component 44, which therefore contributes minimally to the heating of the semiconductor component 44.

The device 40 may also include an electrical component 52, including one or more leads 54 connected to the second substrate 46. The leads 54 may be connected to the second substrate 46 using, for example, conventional mounting techniques, such as a surface mounting construction or a through-hole construction. The electrical component 52 may be any type of electrical component, such as a solid-state device, an electromechanical device, or a electromagnetic device. In the context of a DC/DC converter, as further discussed hereinbelow, the electrical component 52 may be, for example, a transformer, an inductor, a transistor, or a capacitor. In addition, as illustrated in FIG. 2, the semiconductor component 44 may mounted to the first substrate 42 in a position vertically above the electrical component 52 such that the semiconductor component 44 and the electrical component 52 are in a stacked and substantially parallel relationship relative to each other.

The second substrate 46 may be, for example, a circuit board such as, for example, a printed circuit board having a non-conductive substrate layer of, for example, fiberglass, and a wiring layer of, for example, copper or aluminum, connected thereto. The wiring layer of the second substrate 46 may provide an electrical connection between leads of components connected to the second substrate 46, such as the lead 48 of the semiconductor 44 and the lead 54 of the electrical component 52. The present invention will be described hereinafter as including a first substrate 42 in the form of an IMS and a second substrate in the form of a circuit board 46, although benefits of the present invention may be realized using other embodiments, such as a pair of facing circuit boards having the components of the device 40 connected thereto.

The electrical device 40 illustrated in FIG. 2 includes only one semiconductor component 44, one lead 48, and one lead 50. Other embodiments of the present invention, however, may include more elements and leads. Moreover, an embodiment of the present invention may include a plurality of semiconductor components 44 mounted to the IMS 42 and connected in series or parallel. Furthermore, the components 44 may have their own leads or they may share one or more leads 48, 50 as common interconnect nodes.

The leaded cell assembly of the electrical device 40 of the present invention may be embodied as, for example, a converter, such as the forward DC/DC converter 10 illustrated in FIG. 1. According to such an embodiment, the semiconductor component 44 may be one the rectifiers 24, 26, and the electrical component 52 may be the transformer 16. The other of the rectifiers 24, 26 illustrated in FIG. 1 may also be configured according to the leaded cell assembly of the present invention and connected between the IMS 42 and the circuit board 46.

Figure 3:
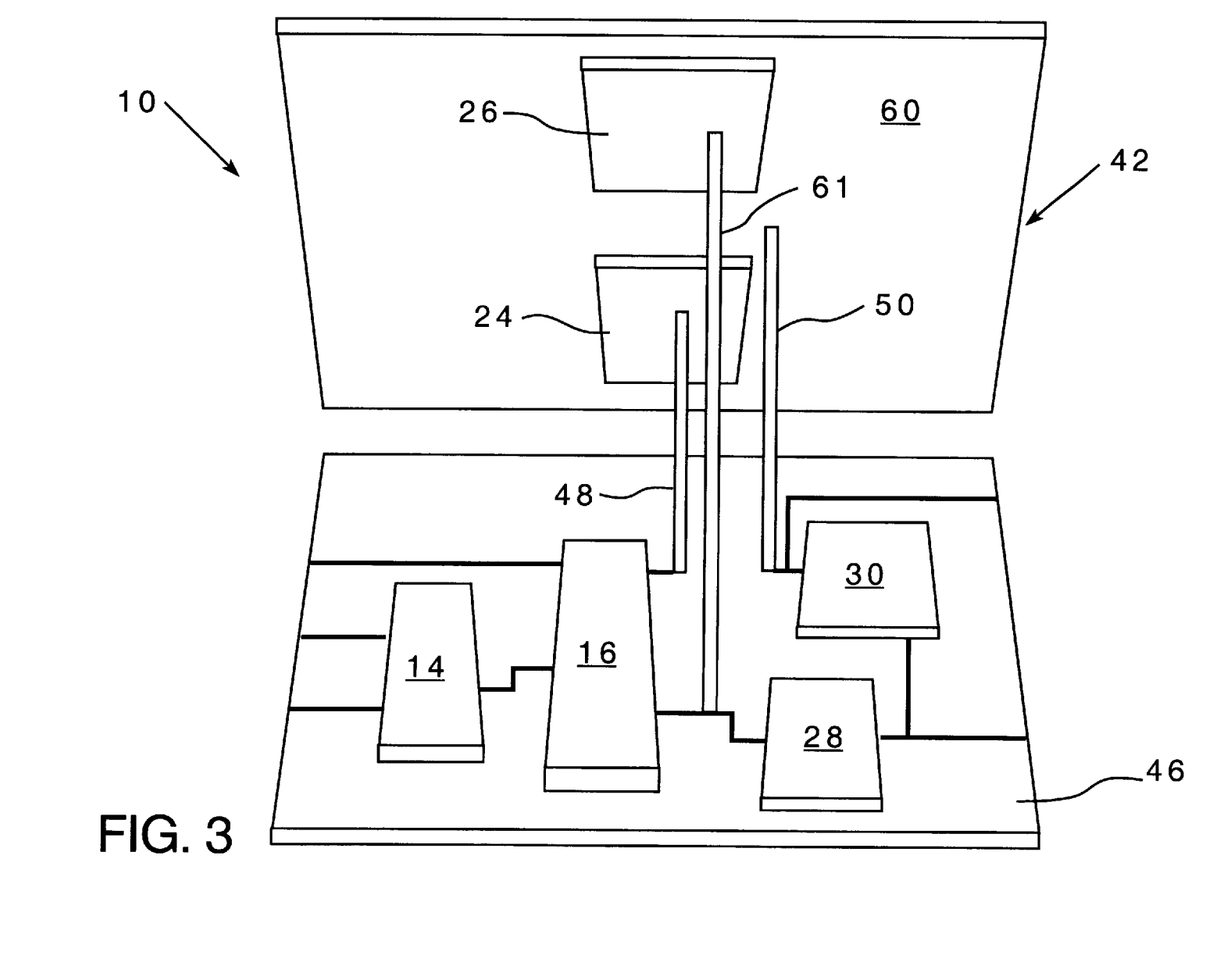
FIG. 3 is a partially exploded front perspective view of a converter including the electrical device of FIG. 2 according to one embodiment of the present invention.

FIG. 3 is a partially exploded front perspective view of the converter 10 according to one embodiment of the present invention. The converter 10 includes rectifiers 24, 26 mounted to the first metal layer 60 of the IMS 42 with leads 48, 61 connecting the anodes of the respective rectifiers 24, 26 to the circuit board 46 according to the leaded cell assembly illustrated in FIG. 2. The converter 10 also includes the switch 14, the transformer 16, the inductor 28, and the capacitor 30 mounted to the circuit board 46. The leads 48, 61 connect the anode terminals of the respective rectifiers 24, 26 to the output terminals of the transformer 16, and the lead 50 connects the common cathode node of the rectifiers 24, 26 to the capacitor 30 and output terminal of the converter 10.

For the illustrated embodiment, the switch 14, the transformer 16, the inductor 28, and the capacitor 30 include individually packaged devices, and the rectifiers 24, 26 include unpackaged semiconductor dies mounted to the IMS 42 in a position vertically above the transformer 16, such that the rectifiers 24, 26 and the transformer 16 are facing in a substantially stacked relationship relative to each other. According to other embodiments of the present invention, other combinations of packaged and unpackaged components may be utilized. Thus, the rectifiers 24, 26 may be physically closer to the transformer 16 than if the rectifiers 24, 26 were individually packaged components and mounted to the circuit board 46. Thus, the inductive loop between the respective components is reduced, minimizing the introduction of stray inductance into the converter 10. Moreover, by removing the packaging associated with the rectifiers 24, 26 of a conventional forward DC/DC converter, the leaded cell assembly of the present invention results in approximately twice the silicon die area for the same footprint area of the IMS 42. In addition, removing the packaging for the rectifiers 24, 26 reduces the thermal path and thermal insulation between the rectifiers 24, 26 and the IMS 42. Consequently, the leaded cell assembly of the present invention reduces the cost of rectifiers and increases the density of power conversion.

A converter incorporating the leaded cell assembly of the present invention may be packaged according to the standard industry full brick size. In addition, environmental protection for the rectifiers 24, 26 may be provided by conventional converter packaging, which typically includes complete encapsulation of the converter 10. The leaded cell assembly interconnect and the DC/DC converter packaging may be accomplished with, for example, standard soldering processes. Therefore, no additional individualized packaging is required for the rectifiers 24, 26 employing the leaded cell assembly of the present invention that would add size to those components and compel a larger inductive loop between the transformer 16 and the rectifiers 24, 26.

Figure 4:
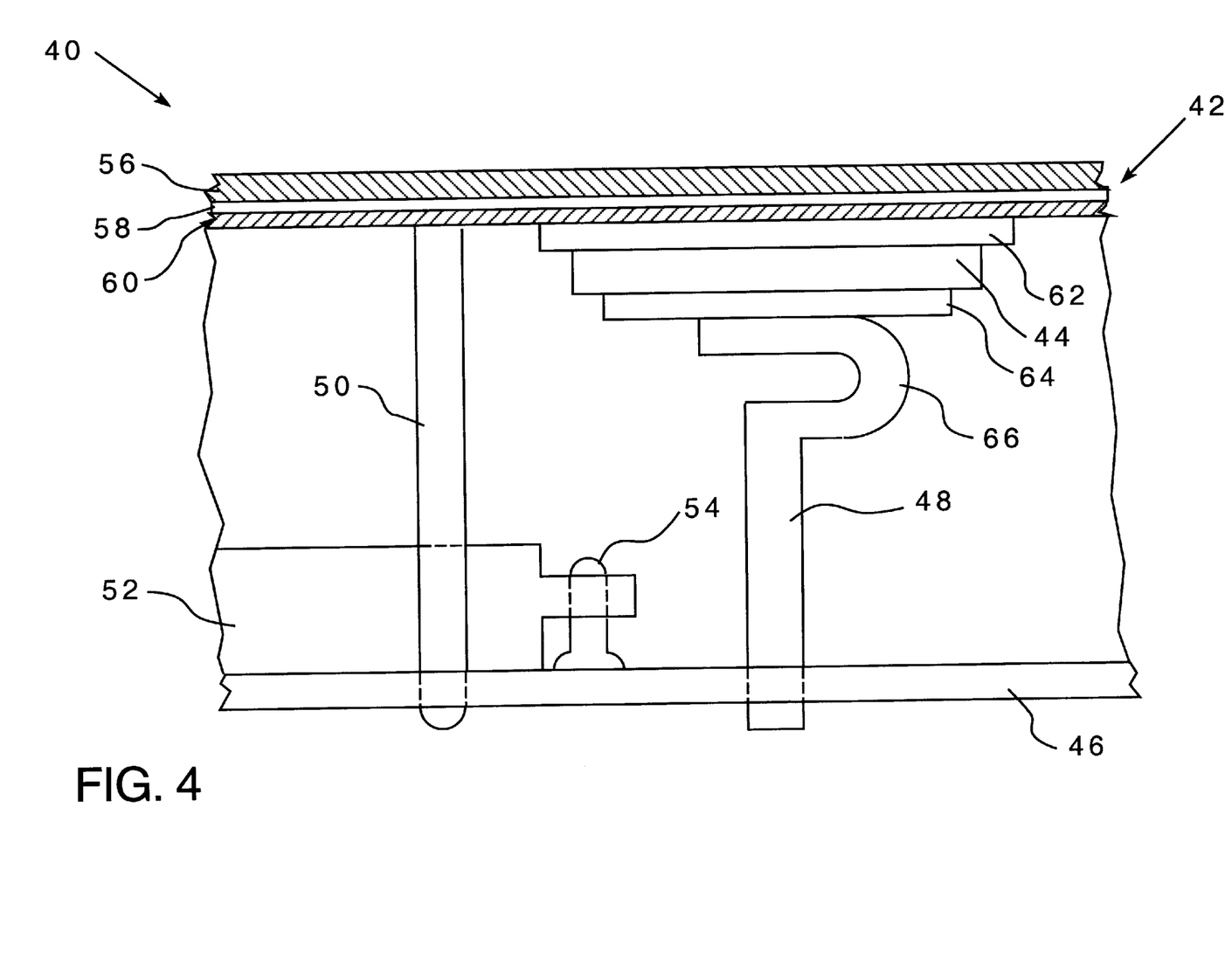
FIG. 4 is a cross-sectional diagram of the electrical device according to another embodiment of the present invention.

FIG. 4 is a cross-sectional diagram of the electrical device 40 according to another embodiment of the present invention. The embodiment illustrated in FIG. 4 includes an electrically conductive tab 62 interposed between the semiconductor component 44 and the IMS 42. The tab 62 may have a thermal coefficient similar to that of the material comprising the semiconductor component 44. For example, for an embodiment in which the semiconductor component 44 includes silicon, the tab 62 may be, for example, a molybdenum tab.

A second electrically conductive tab 64 may be interposed between the semiconductor component 44 and the lead 48, as illustrated in FIG. 4. The tab 64 may also have a thermal coefficient similar to that of the material comprising the semiconductor component 44, and may be, for example, a molybdenum tab for an embodiment in which the semiconductor component 44 includes silicon. Because different materials, such as the material of the semiconductor component 44 and the material of the second metal layer 60 of the IMS 42, expand at different rates in response to rising temperatures, the tabs 62 and 64, having a thermal coefficient similar to that of the material comprising the semiconductor component 44, provide stress relief for thermal expansion of the semiconductor component 44 caused by current flowing through the semiconductor component 44, which helps to prevent the semiconductor component 44 from stressing or cracking.

The lead 48 of the semiconductor component 44 may include a strain relief portion 66. The strain relief portion 66 may include one or more curved portions, although only one curved portion is shown in FIG. 4. The strain relief portion 66 of the lead 48 provides, in conjunction with the tabs 62, 64, additional stress relief for thermal expansion, such as from the semiconductor component 44 and the lead 48 itself. More specifically, the strain relief portion 66 may act as a spring to compensate for the thermal expansion. Benefits of the present invention may be realized with any combination of the elements of FIG. 4. For example, strain relief may be provided by using one or both of the tabs 62, 64, or by using the lead 48 with one or more strain relief portions 66, or by using a combination of those features. Of course, the benefits of the present invention may also be realized without any of the strain relief elements as illustrated in FIG. 2. Furthermore, the electrical device 40 illustrated in FIG. 4 may also be integrated with other components, such as the forward DC/DC converter 10, as described hereinbefore with respect to FIG. 3.

Figure 5:
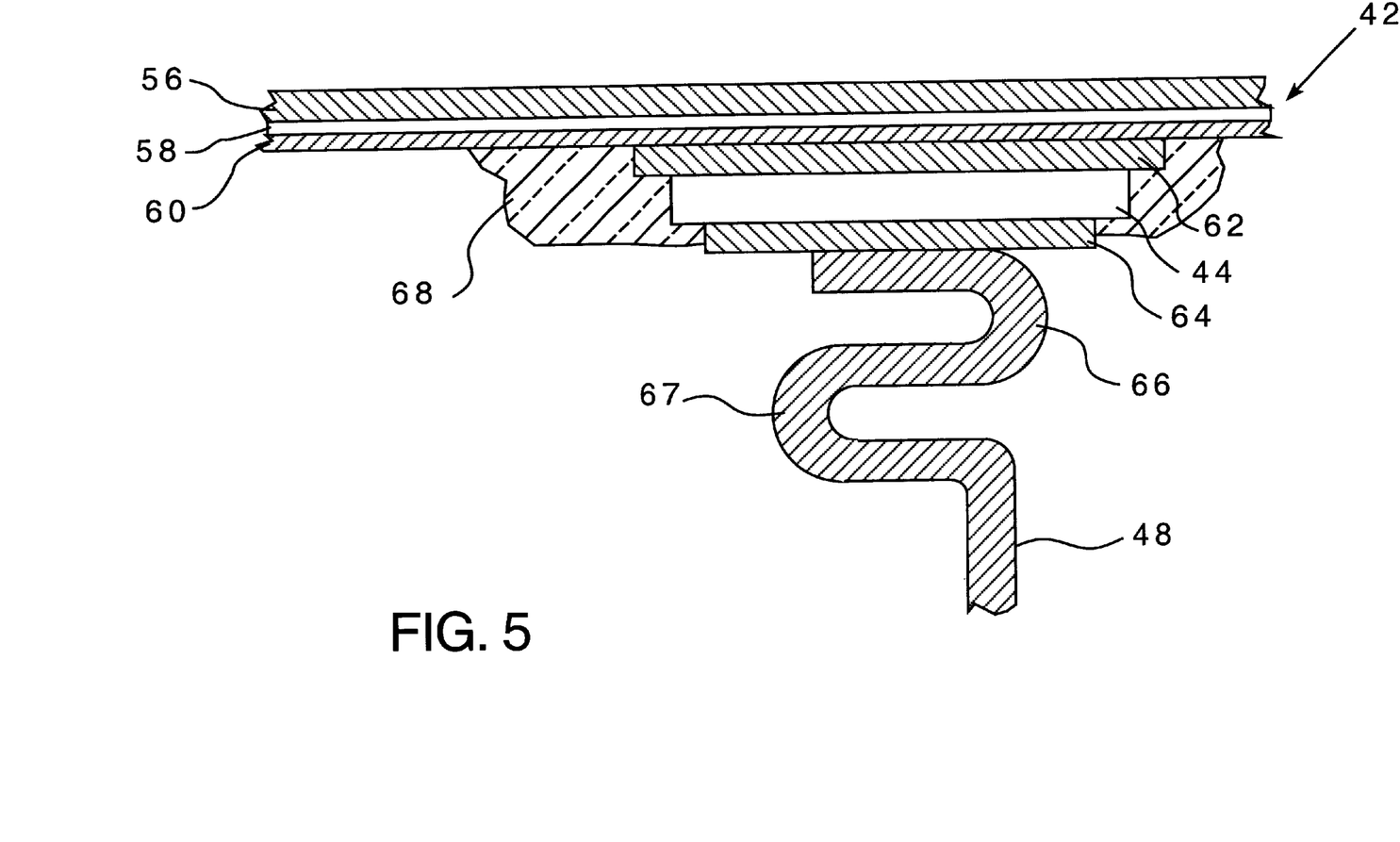
FIG. 5 is a cross-sectional diagram of the leaded cell assembly of the electrical device of FIG. 4 according to another embodiment of the present invention.

FIG. 5 is a cross-sectional diagram of another embodiment of the present invention, and includes the semiconductor component 44, the IMS 42, the tabs 62, 64, and a portion of the lead 48. In that embodiment, the lead 48 includes two strain relief portions 66, 67. In addition, that embodiment includes a layer of non-conductive material 68 covering the semiconductor component 44. The layer of non-conductive material 68 may be utilized to, for example, provide additional environmental protection for the semiconductor component 44. The non-conductive layer 68 may be, for example, a protective, typically epoxy material, commonly referred to as "glop-top." According to another embodiment of the present invention, one non-conductive layer 68 may be utilized to cover a number of semiconductor components 44 where, for example, the semiconductor components 44 are parallel-connected rectifiers. Furthermore, it should be noted that the embodiment of the present invention illustrated in FIG. 5 may be utilized, for example, in a converter, such as the forward DC/DC converter 10 illustrated in FIG. 3.

Figure 6:
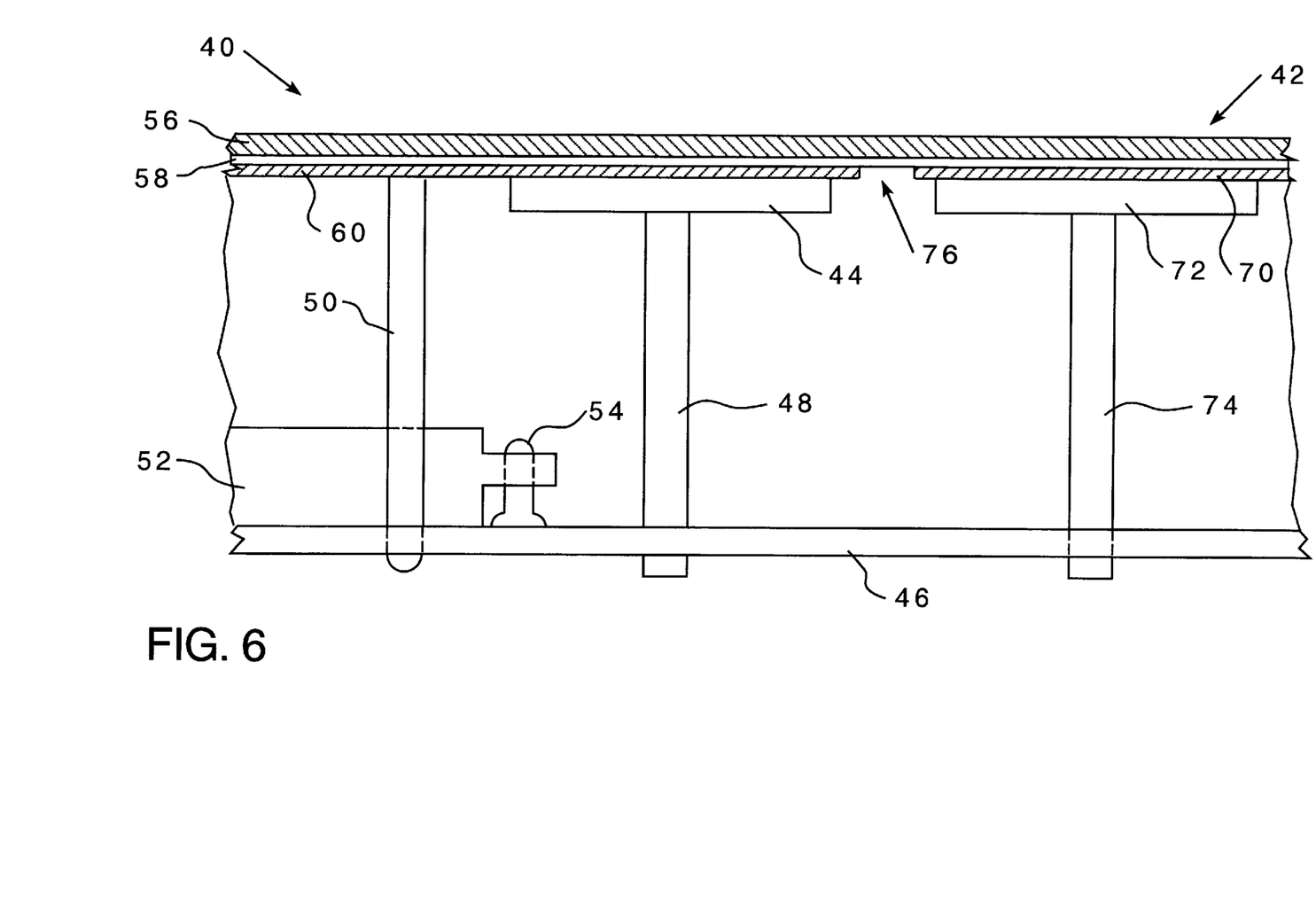
FIG. 6 is a cross-sectional diagram of the electrical device according to another embodiment of the present invention.

FIG. 6 is a cross-sectional diagram of the electrical device 40 according to another embodiment of the present invention. The electrical device 40 illustrated in FIG. 6 is similar to that illustrated in FIG. 2, except that it includes a second leaded cell assembly connected between the IMS 42 and the circuit board 46. The IMS 42 for the electrical device illustrated in FIG. 6 includes a third metal layer 70 connected to the dielectric layer 58 and substantially planar with the second metal layer 60. The third metal layer 70 may be, for example, copper or aluminum, and may be laminated to the dielectric layer 58.

Similar to the leaded cell assembly illustrated in FIG. 2, the second leaded cell assembly includes a semiconductor component 72 and a lead 74 interconnecting the semiconductor component 72 and the circuit board 46. The electrical device 40 illustrated in FIG. 6 may also include a lead (not shown) interconnecting the third metal layer 70 and the circuit board 46. In addition, one or both of the leaded cell assemblies illustrated in FIG. 6 may include any combination of the strain relief elements, such as the first and second conductive tabs 62, 64 or the strain relief portions 66, 67, illustrated in FIGS. 4 and 5.

For the embodiment of the electrical device illustrated in FIG. 6, the third metal layer 70 may be separated from the second metal layer 60 by a non-conductive element 76 such as, for example, an air gap. The width of the element 76 may be sufficient to prohibit the conduction of electrical current between the second metal layer 60 and the third metal layer 70 across the element 76. Accordingly, the embodiment of the present invention illustrated in FIG. 6 may be employed, for example, to connect multiple components to the IMS 42 where the components are not to be electrically connected to each other. Furthermore, a third metal layer 70 connected to the dielectric layer 58 may also be employed where two terminals of a three terminal device are to be connected to the IMS 42. Of course, benefits of the present invention may also be realized with more that two metal layers 60, 70 connected to the dielectric layer 58, and with or without strain relief elements, as discussed hereinbefore.

Although the present invention has been described herein with respect to certain embodiments, those of ordinary skill in the art will recognize that many modifications and variations of the present invention may be implemented, and the foregoing description and the following claims are intended to cover all such modifications and variations. For example, it should be noted that the benefits of the present invention may also be realized where each of the rectifiers 24, 26 of the converter 10 include a number of rectifiers connected in parallel. Such rectifier configurations are sometimes utilized in converters to control the amount of current flowing through each of the rectifiers comprising the rectifiers 24, 26. According to such an embodiment, the electrical device 40 of the present invention may include a number of the semiconductor components 44 mounted to the IMS 42 and electrically connected to the circuit board 46, where each of the semiconductor components 44 includes, for example, one rectifier. According to another embodiment, each of the semiconductor components 44 may include a number of rectifiers. In addition, as discussed hereinbefore, the semiconductor components 44 may share the leads 48, 50 as necessary. Furthermore, the materials and processes disclosed are illustrative, and are not exhaustive, and other materials and processes may be used to make devices embodying the present invention.

What is claimed is:

1. An electrical device, comprising:

a first substrate;

a second substrate facing the first substrate;

an unpackaged semiconductor die electrically and thermally connected to the first substrate;

a first lead electrically connected between the unpackaged semiconductor die and the second substrate; and a second lead electrically connected between the first and second substrates.

2. The device of claim 1, wherein the unpackaged semiconductor die includes an unpackaged silicon die.

3. The device of claim 1, wherein the unpackaged semiconductor die includes a rectifier.

4. The device of claim 1, wherein the first substrate includes an insulated metal substrate.

5. The device of claim 1, wherein the second substrate includes a circuit board.

6. The device of claim 1, further comprising a first conductive tab electrically and thermally connected between the unpackaged semiconductor die and the first substrate.

7. The device of claim 1, further comprising a second conductive tab electrically and thermally connected to the unpackaged semiconductor die and electrically connected to the first lead.

8. The device of claim 1, wherein the first lead includes a strain relief portion.

9. The device of claim 1, including a layer of non-conductive material covering the unpackaged semiconductor die.

10. The device of claim 3, wherein the rectifier includes a Schottky rectifier.

11. The device of claim 6, wherein the first conductive tab includes molybdenum.

12. The device of claim 7, wherein the second conductive tab includes molybdenum.

13. The device of claim 9, wherein the layer of non-conductive material includes epoxy.

14. An electrical device, comprising:

a first substrate;

a second substrate facing the first substrate;

an unpackaged semiconductor die electrically and thermally connected to the first substrate;

a first lead electrically connected between the unpackaged semiconductor die and the second substrate;

a second lead electrically connected between the first and second substrates;

a first conductive tab interposed between the unpackaged semiconductor die and the first substrate; and a second conductive tab interposed between the unpackaged semiconductor die and the first lead.

15. The device of claim 14, wherein:

the unpackaged semiconductor die includes silicon;

the first conductive tab includes molybdenum; and the second conductive tab includes molybdenum.

16. The device of claim 14, wherein:

the first substrate includes an insulated metal substrate; and the second substrate includes a circuit board.

17. The device of claim 14, wherein the first lead includes a strain relief portion.

18. A converter, comprising:

a first substrate;

a second substrate facing the first substrate;

an unpackaged rectifier electrically and thermally connected to the first substrate;

a first lead electrically connected between the rectifier and the second substrate;

a second lead electrically connected between the first and second substrates; and a transformer electrically connected to the second substrate.

19. The converter of claim 18, wherein:

the first substrate includes an insulated metal substrate; and the second substrate includes a circuit board.

20. The converter of claim 18, wherein the rectifier is a Schottky rectifier.

21. The converter of claim 18, wherein the rectifier is one of a plurality of unpackaged rectifiers electrically and thermally connected to the first substrate.

22. The converter of claim 18, wherein the rectifier is facing the transformer.

23. The converter of claim 18, wherein the converter is encapsulated.

* * * * *